(12) United States Patent
Oyamada et al.

(10) Patent No.: US 10,950,570 B2
(45) Date of Patent: *Mar. 16, 2021

(54) BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Iruma (JP)

(72) Inventors: Tetsuya Oyamada, Tokyo (JP); Tomohiro Uno, Tokyo (JP); Hiroyuki Deai, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/305,238

(22) PCT Filed: Apr. 21, 2015

(86) PCT No.: PCT/JP2015/062040
§ 371 (c)(1),
(2) Date: Oct. 19, 2016

(87) PCT Pub. No.: WO2015/163297
PCT Pub. Date: Oct. 29, 2015

(65) Prior Publication Data
US 2017/0040281 A1 Feb. 9, 2017

(30) Foreign Application Priority Data
Apr. 21, 2014 (JP) .............. JP2014-087587

(51) Int. Cl.
| B32B 15/01 | (2006.01) |
| C25D 5/24 | (2006.01) |
| H01L 23/00 | (2006.01) |
| C22C 9/06 | (2006.01) |
| C22C 9/00 | (2006.01) |
| B23K 35/30 | (2006.01) |
| B32B 15/20 | (2006.01) |

(52) U.S. Cl.
CPC ............ H01L 24/45 (2013.01); B23K 35/302 (2013.01); B32B 15/018 (2013.01); B32B 15/20 (2013.01); C22C 9/00 (2013.01); C22C 9/06 (2013.01); H01L 24/43 (2013.01); H01L 2224/05624 (2013.01); H01L 2224/4321 (2013.01); H01L 2224/43825 (2013.01); H01L 2224/43827 (2013.01); H01L 2224/43848 (2013.01); H01L 2224/45 (2013.01); H01L 2224/45147 (2013.01); H01L 2224/45155 (2013.01); H01L 2224/45541 (2013.01); H01L 2224/45565 (2013.01); H01L 2224/45572 (2013.01); H01L 2224/45644 (2013.01); H01L 2224/45664 (2013.01); H01L 2924/00011 (2013.01); H01L 2924/0102 (2013.01); H01L 2924/013 (2013.01); H01L 2924/01005 (2013.01); H01L 2924/01015 (2013.01); H01L 2924/01022 (2013.01); H01L 2924/01046 (2013.01); H01L 2924/01049 (2013.01); H01L 2924/01078 (2013.01); H01L 2924/10253 (2013.01)

(58) Field of Classification Search
CPC .......... B23K 35/302; H01L 224/45155; H01L 2224/45147; C22C 9/06
USPC ........................................................ 428/229
See application file for complete search history.

(56) References Cited

U.S. PATENT DOCUMENTS

| 4,466,939 A * | 8/1984 | Kim .......................... C22F 1/08 148/435 |
| 7,820,913 B2 | 10/2010 | Uno et al. |
| 7,952,028 B2 | 5/2011 | Uno et al. |
| 8,102,061 B2 | 1/2012 | Uno et al. |
| 8,653,668 B2 | 2/2014 | Uno et al. |
| 9,589,694 B2 | 3/2017 | Sarangapani et al. |
| 9,887,172 B2 | 2/2018 | Oda et al. |
| 2004/0014266 A1 | 1/2004 | Uno et al. |
| 2004/0065468 A1 | 4/2004 | Seuntjens |
| 2006/0186544 A1 | 8/2006 | Won et al. |
| 2009/0188696 A1 | 7/2009 | Uno et al. |
| 2010/0282495 A1* | 11/2010 | Uno ...................... B21C 37/047 174/126.2 |
| 2010/0294532 A1 | 11/2010 | Uno et al. |
| 2010/0327450 A1 | 12/2010 | Uno et al. |
| 2011/0120594 A1 | 5/2011 | Uno et al. |
| 2012/0118610 A1* | 5/2012 | Terashima ................ C22C 5/02 174/126.2 |

(Continued)

FOREIGN PATENT DOCUMENTS

| CN | 1318011 A | 10/2001 |
| CN | 101925992 A | 12/2010 |

(Continued)

OTHER PUBLICATIONS

Takada, JP2012036490 Desciption, Feb. 23, 2012.*

(Continued)

Primary Examiner — Humera N. Sheikh
Assistant Examiner — Mary I Omori
(74) Attorney, Agent, or Firm — McDermott Will & Emery LLP

(57) ABSTRACT

There is provided a bonding wire that improves bonding reliability of a ball bonded part and ball formability and is suitable for on-vehicle devices.

The bonding wire for a semiconductor includes a Cu alloy core material, and a Pd coating layer formed on a surface of the Cu alloy core material, and is characterized in that the Cu alloy core material contains Ni, a concentration of Ni is 0.1 to 1.2 wt. % relative to the entire wire, and a thickness of the Pd coating layer is 0.015 to 0.150 μm.

8 Claims, No Drawings

(56) References Cited

U.S. PATENT DOCUMENTS

| | | |
|---|---|---|
| 2012/0292774 A1 | 11/2012 | Itoh |
| 2012/0299182 A1 | 11/2012 | Uno et al. |
| 2013/0042912 A1 | 2/2013 | Kurihara et al. |
| 2013/0140068 A1* | 6/2013 | Sarangapani .......... H01B 1/026 174/257 |
| 2013/0140084 A1* | 6/2013 | Sarangapani .......... H01R 4/029 174/94 R |
| 2013/0180757 A1 | 7/2013 | Uno et al. |
| 2013/0306352 A2 | 11/2013 | Terashima et al. |
| 2015/0054146 A1 | 2/2015 | Itoh |
| 2015/0322586 A1 | 11/2015 | Lyn et al. |
| 2015/0325772 A1 | 11/2015 | Boukai et al. |
| 2016/0126208 A1 | 5/2016 | Lee et al. |
| 2017/0117244 A1 | 4/2017 | Yamada et al. |

FOREIGN PATENT DOCUMENTS

| | | | |
|---|---|---|---|
| CN | 10242204 A | 4/2012 | |
| CN | 102687259 A | 9/2012 | |
| CN | 102776408 A | 11/2012 | |
| CN | 103137235 A | 6/2013 | |
| CN | 103137236 A | 6/2013 | |
| CN | 103943584 A | 7/2014 | |
| CN | 104157625 A | 11/2014 | |
| DE | 3911874 A1 | 10/1989 | |
| EP | 2413351 A1 | 2/2012 | |
| EP | 2461358 A1 | 6/2012 | |
| JP | S60-160554 U | 10/1985 | |
| JP | 61020693 A * | 1/1986 | ............ B23K 35/30 |
| JP | 61-48543 A | 3/1986 | |
| JP | S61-048543 A | 3/1986 | |
| JP | S61-163194 A | 7/1986 | |
| JP | S61-255045 A | 11/1986 | |
| JP | S62-029503 B2 | 6/1987 | |
| JP | S62-130248 A | 6/1987 | |
| JP | S63-235440 A | 9/1988 | |
| JP | S63-241127 A | 10/1988 | |
| JP | S63-247325 A | 10/1988 | |
| JP | H07-070675 A | 3/1995 | |
| JP | H08-319525 A | 12/1996 | |
| JP | 2002-359261 A | 12/2002 | |
| JP | 2004-014884 A | 1/2004 | |
| JP | 2005-167020 A | 6/2005 | |
| JP | 2006-100777 A | 4/2006 | |
| JP | 2006-190763 A | 7/2006 | |
| JP | 2008-085319 A | 4/2008 | |
| JP | 2008-085320 A | 4/2008 | |
| JP | 2009-158931 A | 7/2009 | |
| JP | 2010-153918 A | 7/2010 | |
| JP | 2010225722 A * | 10/2010 | ......... B23K 35/0261 |
| JP | 4637256 B1 | 2/2011 | |
| JP | 2011-077254 A | 4/2011 | |
| JP | 2011-091404 A | 5/2011 | |
| JP | 2011-124611 A | 6/2011 | |
| JP | 2011-159894 A | 8/2011 | |
| JP | 2012-036490 A | 2/2012 | |
| JP | 2013-118261 A | 6/2013 | |
| JP | 2014-070252 A | 4/2014 | |
| JP | 2014-165272 A | 9/2014 | |
| JP | 2015-002213 A | 1/2015 | |
| KR | 10-2004-0073667 A | 8/2004 | |
| KR | 10-2010-0023893 A | 3/2010 | |
| KR | 10-2012-0046019 A | 5/2012 | |
| KR | 10-2015-0030554 A | 3/2015 | |
| TW | 201140718 A | 11/2011 | |
| TW | 201140782 A | 11/2011 | |
| TW | 201207129 A1 | 2/2012 | |
| TW | 201309410 A | 3/2013 | |
| WO | 2009/093554 A1 | 7/2009 | |
| WO | 2011/013527 A1 | 2/2011 | |
| WO | 2011/093038 A1 | 8/2011 | |
| WO | 2015/115241 A1 | 8/2015 | |
| WO | 2015/163297 A1 | 10/2015 | |

OTHER PUBLICATIONS

Yamashita et al., Machine translation of JP 2010-225722 Description, Oct. 7, 2010 (Year: 2010).*

Yamane et al., Translation of JP 61020693 Abstract and machine translation of JP 61020693 Description, Jan. 29, 1986 (Year: 1986).*

Search Report issued in corresponding International Application No. PCT/JP2015/062040, dated Jul. 21, 2015.

Decision to Grant issued in corresponding Japanese Patent Application No. 2016-514933, dated Jun. 6, 2017.

Office Action issued in corresponding Korean Patent Application No. 10-2016-7029247, dated Oct. 30, 2017.

Chinese Office Action issued in corresponding Chinese Patent Application No. 201580020829.0, dated Jul. 3, 2018, with English Translation.

European Search Report issued in corresponding EP Application No. 15782477.2, issued Feb. 12, 2018.

Chinese Office Action issued in corresponding Chinese Patent Application No. 201580020829.0, dated Jan. 29, 2019, with English Translation.

Japanese Office Action issued in corresponding Japanese Patent Applicaiton No. 2017-123904, dated Feb. 26, 2019, with English Translation.

Chinese Office Action issued in corresponding Chinese Patent Application No. 201580002609.5, dated Mar. 20, 2018, with English Translation.

Chinese Office Action issued in corresponding Chinese Patent Application No. 201580020010.4, dated Jun. 29. 2018, with English Translation.

Search Report International Application No. PCT/JP2015/066385 dated Aug. 25, 2015.

Notification of Reasons for Refusal Japanese Patent Application No. 2015-532223 dated Sep. 24, 2015 with full English translation.

Notification of Reasons for Refusal Japanese Patent Application No. 2015-532223 dated Jan. 5, 2016 with full English translation.

Decision to Grant a Patent Japanese Patent Application No. 2015-532223 dated Mar. 1, 2016 with full English.

Partial Supplementary European Search Report issued in corresponding EP Patent Application No. 15866377.3, dated Jan. 10, 2017.

Korean Decision to Grant issued in Application No. 10-2016-7028190 dated Apr. 25, 2017, with English translation.

Notice of Rejection issued in corresponding Japanese Patent Application No. 2015-560454, dated Mar. 15, 2016.

Decision of Patent Grant issued in corresponding Japanese Patent Application No. 2015-560454, dated Aug. 9, 2016.

Search Report issued in corresponding International Application No. PCT/JP2015/076487, dated Dec. 8, 2015.

Jae-Hyung Cho, et al. "Investigation of Recrystallization and Grain Growth of Copper and Gold Bonding Wires", Metallurgical and Materials Transactions, 37(10): pp: 3085-3097 (2006).

Extended European Search Report issued in corresponding EP Patent Application No. 15866377.3, dated May 2, 2017.

Office Action issued in corresponding Korean Patent Application No. 10-2016-7028190, dated Feb. 17, 2017.

Extended European Search Report issued in corresponding EP Patent Application No. 15889429.5, dated Apr. 24. 2017.

Decision to Grant issued in corresponding Taiwan Patent Application No. 104130999, dated Nov. 30, 2016.

Partial Supplementary European Search Report issued in corresponding EP Application No. 15889429.5, dated Jan. 10, 2017.

Search Report issued in corresponding International Patent Application No. PCT/JP2016/068764, dated Sep. 13, 2016.

Korean Office Action issued in corresponding Korean Patent Application No. 10-2017-7018735, dated Jul. 9, 2020, with English translation.

Japanese Office Action issued in corresponding Japanese Patent Application No. 2019-213056, dated Sep. 23, 2020 with English translation.

Japanese Office Action issued in corresponding Japanese Patent Application No. 2019-190313, dated Oct. 6, 2020, with English translation.

(56) References Cited

OTHER PUBLICATIONS

Taiwanese Office Action issued in corresponding Taiwanese Patent Application No. 109108341 dated Jan. 8, 2021, with English translation.

* cited by examiner

BONDING WIRE FOR SEMICONDUCTOR DEVICE

CROSS REFERENCE

This application is the U.S. National Phase under 35 US.C. § 371 of International Application No. PCT/JP2015/062040, filed on Apr. 21, 2015, which claims the benefit of Japanese Application No. 2014-087587, filed on Apr. 21, 2014, the entire contents of each are hereby incorporated by reference.

TECHNICAL FIELD

The present invention relates to a bonding wire for a semiconductor device used to connect electrodes on a semiconductor device and wiring of a circuit wiring board such as external leads.

BACKGROUND ART

As a bonding wire for a semiconductor device which connects electrodes on a semiconductor device and external leads (hereinafter referred to as a "bonding wire"), a thin wire with a wire diameter of about 15 to 50 µm is mainly used today. For a bonding method with bonding wire, there is generally used a thermal compressive bonding technique with the aid of ultrasound, in which a general bonding device, a capillary tool used for bonding by passing a bonding wire therethrough, and the like are used. A bonding process of a bonding wire is carried out by heating and melting a tip of wire by arc heat input to form a ball through surface tension; crimp-bonding the ball part onto an electrode of the semiconductor device heated within a range of 150 to 300° C. (hereinafter referred to as "ball bonding"); forming a loop; and finally crimp-bonding a wire part onto an electrode of the external lead (hereinafter referred to as "wedge bonding"). For the electrode on the semiconductor device as an object to be bonded with the bonding wire, there is used an electrode structure in which a film of alloy mainly containing Al is formed on a Si substrate. For the electrode of the external lead, an electrode structure with Ag plating or Pd plating is used.

Although Au has been mainly used for a material of the bonding wire, a replacement of Au with Cu is being conducted mainly in LSI use. On the background of recent proliferation of electric vehicles and hybrid vehicles, needs for replacing Au with Cu are increasing also in on-vehicle device use.

In comparison to general electronic devices, on-vehicle devices are required to operate under a rigorous high-temperature and high-humidity environment. It is therefore required for on-vehicle devices to have an excellent bonding longevity of a ball bonded part (hereinafter referred to as a "bonding reliability"), and to enable a stable formation of ball with excellent sphericity (hereinafter referred to as a "ball formability") for achieving a stable bonding strength.

It is also required for on-vehicle devices to cope with a densification of mounting associated with high functionalization and miniaturization. With an increase in mounting density, a diameter of bonding wire becomes thinner and then an area that contributes to bonding at the time of wedge bonding decreases, which results in difficulty to achieve a bonding strength. Therefore, it is necessary to achieve a high bonding strength at a wedge bonded part, that is, to improve wedge bondability. There is also required a technique of deforming a ball to a true circular shape at the time of ball bonding, because a distance narrows between electrodes on a semiconductor device and it is thus concerned that a ball becomes in contact with an adjacent electrode to cause short circuit. Furthermore, when subjected to resin sealing, it is necessary to obtain a linearity of loop and to reduce variation in loop height in order to prevent adjacent wires from coming in contact with each other due to deformation of bonding wires caused by resin flow.

As for a Cu bonding wire, there has been proposed a wire using high-purity Cu (purity: 99.99 wt. % or more) (for example, Patent Literature 1). Cu has the drawback of being more susceptible to oxidation than Au and has problems in that bonding reliability, ball formability and wedge bondability are inferior. As a method for preventing surface oxidation of a Cu bonding wire, there has been proposed a structure in which a surface of Cu core material is coated with a metal such as Au, Ag, Pt, Pd, Ni, Co, Cr and Ti (Patent Literature 2). There has been also proposed a structure in which a surface of Cu core material is coated with Pd and a surface thereof is coated with Au, Ag, Cu or an alloy thereof (Patent Literature 3).

RELATED ART REFERENCE

Patent Literature

Patent Literature 1: JP-A-S61-48543
Patent Literature 2: JP-A-2005-167020
Patent Literature 3: JP-A-2012-36490

SUMMARY OF INVENTION

Problem to be Solved by the Invention

The present inventors studied in light of properties required for on-vehicle devices and, as a result, found that practical problems still remain in the conventional Cu bonding wire having Pd coating layer as noted below.

In comparison to general electronic devices, on-vehicle devices require bonding reliability in a rigorous high-temperature and high-humidity environment. Some methods are developed for evaluating the bonding reliability, and a representative evaluation method includes a high-temperature and high-humidity test. In a case of general electronic devices, the high-temperature and high-humidity test is usually conducted under a condition of a temperature of 130° C. and a relative humidity of 85%. In contrast, on-vehicle devices require a practical performance at higher temperature and thus require a bonding reliability of 1500 hours or more in a condition of a temperature of 150° C. and a relative humidity of 85%.

It has been found that, in a case when a conventional Cu bonding wire having a Pd coating layer is used to perform a bonding operation with a pure Al electrode, followed by performing a sealing operation with an epoxy resin and conducting a high-temperature and high-humidity test in a condition of a temperature of 150° C. and a relative humidity of 85%, a bonding strength decreases within 1500 hours or less due to the occurrence of cracks in bonding interface, and the bonding reliability required for on-vehicle devices is not achieved. According to detailed observation on the bonding interface, a plurality of intermetallic compounds based on Al and Cu are formed. The decrease in bonding strength is estimated to be caused by a preferential corrosion of $Cu_9Al_4$ among these compounds.

As a result of evaluating a ball formability, it has been found that, a conventional Cu bonding wire having a Pd coating layer cannot meet the ball formability required for on-vehicle devices. In particular, there was frequently observed a ball having voids on surface thereof and a ball having poor sphericity. As for a cause of voids occurrence, it is considered because $H_2$ and $N_2$ that were absorbed when Pd was melt with an arc discharge are released during a solidification of Pd. As for a cause of decrease in sphericity, it is considered an effect of thermal conductivity. A ball is solidified by releasing heat toward a wire. Pd has a low thermal conductivity compared to Cu and Cu is solidified earlier than Pd, which results in that a surface Pd cannot be deformed so as to follow a solidification and shrinkage of Cu and a surface irregularity occurs. Such phenomenon becomes more marked with increasing a thickness of Pd coating layer. Even in a case where Au, Ag or Cu was coated on a Pd coating layer, a ball formability could not be improved.

In view of the above result of study, it has been revealed that, when using a conventional Cu bonding wire having a Pd coating layer, it is not able to meet a criterion for a bonding reliability and a ball formability required for on-vehicle devices. It has been also revealed that, even when using improved methods focused on a thickness and structure of Pd coating layer which has been conventionally studied, there cannot be achieved a bonding reliability and a ball formability required for on-vehicle devices at the same time.

It is therefore an object of the present invention to provide a bonding wire that improves bonding reliability of a ball bonded part and a ball formability and is suitable for on-vehicle devices.

Means for Solving Problem

A bonding wire of the present invention is a bonding wire for a semiconductor device including a Cu alloy core material and a Pd coating layer formed on a surface of the Cu alloy core material, and is characterized in that the Cu alloy core material contains Ni, a concentration of Ni is 0.1 to 1.2 wt. % relative to the entire wire, and a thickness of the Pd coating layer is 0.015 to 0.150 μm.

Effect of the Invention

The present invention includes a Pd coating layer and a Cu alloy core material containing Ni. In the present invention, Pd or Ni is concentrated at a bonding interface with electrode in a ball bonded part and a diffusion of Cu and Al at the bonding interface during a high-temperature and high-humidity test is reduced, which can reduce a growth rate of corrodible compound. It is thus able to improve the bonding reliability. Also, in the present invention, a concentration of Ni is 0.1 wt. % or more relative to the entire wire, and thus, an occurrence of surface irregularity of ball can be reduced, which leads to improvement in a ball formability.

EMBODIMENT FOR CARRYING OUT THE INVENTION

There will be described an embodiment of the present invention in detail bellow.

1. EMBODIMENT (General Constitution)

A bonding wire of an embodiment of the present invention includes a Cu alloy core material and a Pd coating layer formed on a surface of the Cu alloy core material. The Cu alloy core material contains Ni, a concentration of Ni is 0.1 to 1.2 wt. % relative to the entire wire, and a thickness of the Pd coating layer is 0.015 to 0.150 μm. With this configuration, the bonding wire can improve a bonding reliability and ball formability required for on-vehicle devices.

There will be described the definition of the Cu alloy core material and the Pd coating layer of the bonding wire. A boundary between the Cu alloy core material and the Pd coating layer was determined based on a concentration of Pd. The boundary was set to be a position at which a concentration of Pd was 50 at. %, and a region in which a concentration of Pd was 50 at. % or more was determined to be the Pd coating layer, and a region in which a concentration of Pd was less than 50 at. % was determined to be the Cu alloy core material. This is because if a concentration of Pd is 50 at. % or more in the Pd coating layer, there can be expected an effect of improving characteristics from the structure of the Pd coating layer. The Pd coating layer may contain a region of a Pd single layer and a region having concentration gradients of Pd and Cu in a wire depth direction. The reason why the region having the concentration gradients is formed in the Pd coating layer is that atoms of Pd and Cu may diffuse through heat treatment or the like in a manufacturing process. In addition, the Pd coating layer may contain inevitable impurities. Furthermore, Ni contained in the Cu alloy core material may be diffused to the Pd coating layer through heat treatment or the like and may be present in the Pd coating layer.

When a ball is formed using such bonding wire by arc discharge, an alloy layer having a higher concentration of Pd or Ni than an inside of the ball is formed in a surface of the ball during the process when the bonding wire melts and solidifies. Such ball is used to bond with an Al electrode and a high-temperature and high-humidity test is performed, which allows Pd or Ni to be concentrated at a bonding interface. A concentrated layer formed by the concentrated Pd or Ni can reduce a diffusion of Cu and Al at a bonding interface during a high-temperature and high-humidity test and can reduce a growth rate of corrodible compound. Thus, the bonding wire can increase the bonding reliability. On the other hand, when a concentration of Ni is less than 0.1 wt. % or a thickness of Pd coating layer is less than 0.015 μm, the concentrated layer is not sufficiently formed and thus the bonding reliability cannot be increased.

The alloy layer with a high concentration of Pd or Ni formed on a surface of the ball is excellent in oxidation resistance and can thereby reduce failures such as deviation of a ball forming position relative to a center of the bonding wire at the time of ball formation.

In addition, an occurrence of surface irregularity of ball can be reduced by the configuration that a Cu alloy of core material contains Ni and a concentration of Ni is 0.1 wt. %; or more relative to the entire wire. This is considered because a thermal conductivity of a Cu alloy core material is decreased by adding Ni into a Cu alloy of core material and becomes closer to a thermal conductivity of a Pd coating layer, which can reduce a difference between ball surface and ball inside for a required time from molten state to completing solidification.

On the other hand, when a concentration of Ni becomes more than 1.2 wt. % relative to the entire wire, it is not suitable for practical use because a ball hardens and Si chip damage at the time of ball bonding becomes a problem. When a thickness of Pd coating layer becomes 0.150 μm or more, there cannot be obtained good ball formability because voids occur in a ball surface when forming a ball.

In some cases, Cu is present at an outermost surface of the Pd coating layer.

The bonding wire may further include an Au skin layer of a thickness of 0.0005 to 0.050 μm formed on a surface of the Pd coating layer. With this configuration, the bonding wire can further increase the bonding reliability and can improve the wedge bondability.

There will be described the definition of the Au skin layer of the bonding wire. A boundary between the Au skin layer and the Pd coating layer was determined based on a concentration of Au. The boundary was set to be a position at which a concentration of Au was 10 at. %, and a region in which a concentration of Au was 10 at. % or more was determined to be the Au skin layer, and a region in which a concentration of Au was less than 10 at. % was determined to be the Pd coating layer. Even in the region in which a concentration of Pd was 50 at. % or more, a region in which Au was present at 10 at. % or more was determined to be the Au skin layer. These determinations are because if a concentration of Au falls within the range mentioned above, there can be expected an effect of improving characteristics from the structure of the Au skin layer. The Au skin layer is an Au—Pd alloy and a region including a region having concentration gradients of Au and Pd in the wire depth direction. The reason why the region having the concentration gradients is formed in the Au skin layer is that atoms of Au and Pd diffuse through heat treatment or the like in the manufacturing process. Furthermore, the Au skin layer may contain inevitable impurities.

In a high-temperature and high-humidity test, Au forms a concentrated layer of ternary system alloy of Au, Ni and Pd in combination with Ni and Pd at a bonding interface in a ball bonded part, which can remarkably reduce a growth rate of corrodible compound. Thus, the bonding wire can further increase a bonding reliability. The Au skin layer also reacts with Ni contained in the Pd coating layer or the Cu alloy core material to increase adhesive strength among the Au skin layer, the Pd coating layer and the Cu alloy core material and to prevent the Pd coating layer and the Au skin layer from peeling at the time of wedge bonding. Accordingly, the bonding wire can improve the wedge bondability. If a thickness of the Au skin layer is less than 0.0005 μm, the above effect is not obtained. If the thickness becomes more than 0.050 μm, it is not suitable for practical use because a propagation of ultrasonic wave at the time of wedge bonding degrades and a good bonding strength cannot be obtained. The Au skin layer can be formed by the same method as the Pd coating layer. In some cases, Cu is present at an outermost surface of the Au skin layer.

In the bonding wire, when the Cu alloy core material further contains at least one element selected from B, In, Ca, P and Ti and a concentration of the elements is 3 to 100 wt. ppm relative to the entire wire, there can be improved a crushed shape of a ball bonded part required for high-density mounting, that is, there can be improved a circularity of shape of a ball bonded part. This is because an addition of the elements can allow a size of crystal grain in the ball to be fine and can reduce a deformation of the ball. If a concentration of the elements relative to the entire wire is less than 3 wt. ppm, the above effect is not obtained. If the concentration exceeds 100 wt. ppm, it is not suitable for practical use because the ball hardens and chip damage at the time of ball bonding becomes a problem.

In the bonding wire, when the Cu alloy core material further contains Pt or Pd and a concentration of Pt or Pd contained in the Cu alloy core material is 0.05 to 1.20 wt. %, there can be increased a loop formability, that is, there can be increased a linearity of loop required for high density mounting and can be decreased a variation in loop height. This is because the Cu alloy core material contains Pd or Pt to increase a yield strength of bonding wire, which can reduce a deformation of bonding wire. In order to increase a linearity of loop and to reduce a variation in loop height, it is more effective that the Cu alloy core material has higher strength. There cannot be obtained sufficient effect even when improving a coating structure such as increasing a thickness of the Pd coating layer. If a concentration of Pt or Pd contained in the Cu alloy core material is less than 0.05 wt. %, the above effect is not obtained. If the concentration exceeds 1.20 wt. %, the bonding wire hardens and a deformation of a bonded part of wire becomes insufficient, and a decrease in wedge bondability becomes a problem.

For a concentration analysis of wire surface in order to determine the Pd coating layer and the Au skin layer, a method of performing analysis while trimming the bonding wire from its surface in the depth direction by sputtering or the like, or a method of exposing a cross-section of the wire and performing a line analysis, a point analysis, or the like thereon is effective. As a method for exposing a cross-section of wire, a mechanical polishing, an ion etching, etc., can be applied. For an analyzer used for concentration analysis, an Auger electron spectroscopic apparatus installed in a scanning electron microscope or a transmission electron microscope, an energy dispersive X-ray analyzer, and an electron probe micro analyzer, etc., can be applied. Among these concentration analysis methods, an analysis method using a scanning electron microscope in which both of a sputtering apparatus and an Auger electron spectroscopic apparatus are installed is preferable because it can obtain a concentration profile in a depth direction with regard to a plurality of elements in a relatively short time. For a concentration analysis of elements contained in the entire bonding wire, there can be used an ICP emission spectrometer.

(Manufacturing Method)

Next, there will be described a method for manufacturing the bonding wire according to the embodiment of the present invention. The bonding wire is obtained by manufacturing a Cu alloy used for a core material, working it into a thin wire, forming a Pd coating layer and an Au skin layer, and performing heat treatment. After forming the Pd coating layer and the Au skin layer, another wire drawing and heat treatment may be performed. There will be described in detail a method for manufacturing the Cu alloy core material, a method for forming the Pd coating layer and the Au skin layer, and a method of heat treatment.

The Cu core alloy used for a core material is obtained by melting Cu as a raw material and additive elements together and solidifying them. An arc heating furnace, a high-frequency heating furnace, a resistance heating furnace, or the like can be used for the melting. In order to prevent gases such as $O_2$, $N_2$ and $H_2$ being mixed therein from air, the melting is preferably performed in a vacuum atmosphere or an inert atmosphere such as Ar and $N_2$.

A method for forming the Pd coating layer and the Au skin layer on a surface of the Cu alloy core material includes a plating method, a vapor deposition method, and a melting method. For a plating method, both of an electroplating method and an electroless plating method can be used. The electroplating, called a strike plating or a flash plating, is high in plating speed and is favorable in adhesiveness with a substrate. A solution used for electroless plating is classified into a substitutional type and a reduction type. Although performing the substitutional type plating alone is sufficient for a smaller thickness, it is effective for a larger thickness to perform the reduction type plating after the substitutional type plating in a step-by-step manner.

For a vapor deposition method, there can be used a physical adsorption such as a sputtering method, an ion plating method and a vacuum vapor deposition, and a chemical adsorption such as plasma CVD. They are all dry processes, and are free from the necessity of cleaning after forming the Pd coating layer and the Au skin layer and from any concern about surface contamination and the like during cleaning.

For a formation of the Pd coating layer and the Au skin layer, both a method of forming them after performing wire drawing to a final diameter of wire and a method of forming them on a Cu alloy core material of large diameter and then performing wire drawing several times until obtaining a target diameter of wire are effective. In the former in which the Pd coating layer and the Au skin layer are formed at the final diameter of wire, a manufacture, a quality control, and the like are simple. In the latter in which the wire drawing is performed in combination with the formed Pd coating layer and Au skin layer, there is the advantage that adhesiveness with the Cu alloy core material improves. Specific examples of the respective formation methods include a method of forming the Pd coating layer and the Au skin layer on a Cu alloy core material with a final diameter by successively sweeping the wire through an electroplating solution and a method of forming the Pd coating layer and the Au skin layer by immersing a Cu alloy core material of large diameter into an electro or electroless plating solution and then drawing the wire to achieve a final diameter of wire.

After forming the Pd coating layer and the Au skin layer, heat treatment may be carried out. By carrying out the heat treatment, diffusion of atoms occurs among the Au skin layer, the Pd coating layer and the Cu alloy core material, which improves adhesive strength therebetween and is effective in that the Au skin layer and the Pd coating layer are prevented from peeling during working, and thus, improving productivity. In order to prevent $O_2$ being mixed therein from air, it is preferable to perform the melting in a vacuum atmosphere or an inert atmosphere such as Ar or $N_2$.

The present invention is not limited to the above embodiment, and appropriate alterations can be made within the scope of the spirit of the present invention.

2. EXAMPLE

The bonding wire according to an embodiment of the present invention will be described in detail below with reference to examples.

(Sample)

First, there will be described a method for manufacturing a sample. For Cu and Ni as a raw material of a core material, the ones with a purity of 99.99 wt. % or more and containing inevitable impurities as the remainder was used. For B, In, Ca, P, Ti, Pt and Pd, the ones with a purity of 99 wt. % or more and containing inevitable impurities as the remainder were used.

The Cu alloy for the core material was manufactured by charging the raw materials into a carbon crucible worked into a cylindrical shape with a diameter of 3 to 6 mm, heating and melting the raw materials at 1,090 to 1,300° C. in vacuum or in an inert atmosphere such as an $N_2$ or Ar gas using a high-frequency furnace, and performing furnace cooling. The obtained alloy with a diameter of 3 mm was drawn to manufacture a wire with a diameter of 0.9 to 1.2 mm. Thereafter, a wire with a diameter of 300 to 600 μm was manufactured by successively performing wire drawing and the like using a die. A commercially available lubricant was used for the wire drawing, and a wire drawing speed was 20 to 150 m/min. In order to remove an oxide film on a surface of wire, a pickling treatment with hydrochloric acid was performed, and a Pd coating layer was formed by 1 to 15 μm so as to cover the entire surface of the Cu alloy as the core material. Furthermore, for some wires, an Au skin layer was formed by 0.05 to 1.5 μm on the Pd coating layer. For the formation of the Pd coating layer and the Au skin layer, electroplating was used. A commercially available semiconductor plating solution was used for a plating solution. Heat treatment at 200 to 500° C. and wire drawing were then repeatedly carried out to perform working to a diameter of 20 μm. After working, heat treatment was performed in vacuum or while being flowed with an Ar gas so that breaking elongation will finally be about 9 to 15%. A method of heat treatment was performed while successively sweeping the wire and was carried out while being flowed with an Ar gas. A wire feeding speed was 20 to 200 m/min, a heat treatment temperature was 200 to 600° C., and a heat treatment time was 0.2 to 1.0 second.

The configurations of the samples manufactured according to the above procedure are listed in Tables 1-1, 1-2, 1-3 and 2. The thicknesses of the Pd coating layer and the Au skin layer described in Tables are calculated values based on concentration profiles of Pd, Au and Cu in a depth direction which is obtained by conducting an Auger electron spectroscopy analysis while trimming a wire surface with an Ar ion sputtering.

TABLE 1-1

| Remarks | Concentraton of Ni relative to entire wire (wt. %) | Thickness of Pd coating layer (μm) | Thickness of Au skin layer (μm) | Concentration of each element relative to entire wire | | | | Concentration of each element in Cu alloy core material | | Wire diameter (μm) |
|---|---|---|---|---|---|---|---|---|---|---|
| | | | | B conc. (wt. ppm) | In conc. (wt. ppm) | Ca conc. (wt. ppm) | P conc. (wt. ppm) | Pt conc. (wt. %) | Pd conc. (wt. %) | |
| Example 1 | 0.1 | 0.016 | — | — | — | — | — | — | — | 20 |
| Example 2 | 0.2 | 0.090 | — | — | — | — | — | — | — | 20 |
| Example 3 | 0.3 | 0.150 | — | — | — | — | — | — | — | 20 |
| Example 4 | 0.8 | 0.017 | — | — | — | — | — | — | — | 20 |
| Example 5 | 0.8 | 0.110 | — | — | — | — | — | — | — | 20 |
| Example 6 | 0.8 | 0.150 | — | — | — | — | — | — | — | 20 |
| Example 7 | 1.2 | 0.150 | — | — | — | — | — | — | — | 20 |
| Example 8 | 1.2 | 0.110 | — | — | — | — | — | — | — | 20 |
| Example 9 | 1.2 | 0.150 | — | — | — | — | — | — | — | 20 |
| Example 10 | 0.2 | 0.016 | 0.002 | — | — | — | — | — | — | 20 |
| Example 11 | 0.1 | 0.016 | 0.050 | — | — | — | — | — | — | 20 |
| Example 12 | 0.1 | 0.150 | 0.003 | — | — | — | — | — | — | 20 |

TABLE 1-1-continued

| Remarks | Concentration of Ni relative to entire wire (wt. %) | Thickness of Pd coating layer (μm) | Thickness of Au skin layer (μm) | Concentration of each element relative to entire wire | | | | Concentration of each element in Cu alloy core material | | Wire diameter (μm) |
|---|---|---|---|---|---|---|---|---|---|---|
| | | | | B conc. (wt. ppm) | In conc. (wt. ppm) | Ca conc. (wt. ppm) | P conc. (wt. ppm) | Pt conc. (wt. %) | Pd conc. (wt. %) | |
| Example 13 | 0.2 | 0.150 | 0.040 | — | — | — | — | — | — | 20 |
| Example 14 | 0.7 | 0.016 | 0.002 | — | — | — | — | — | — | 20 |
| Example 15 | 0.7 | 0.016 | 0.050 | — | — | — | — | — | — | 20 |
| Example 16 | 0.7 | 0.150 | 0.004 | — | — | — | — | — | — | 20 |
| Example 17 | 0.7 | 0.150 | 0.040 | — | — | — | — | — | — | 20 |
| Example 18 | 1.2 | 0.016 | 0.002 | — | — | — | — | — | — | 20 |
| Example 19 | 1.2 | 0.016 | 0.040 | — | — | — | — | — | — | 20 |
| Example 20 | 1.2 | 0.150 | 0.002 | — | — | — | — | — | — | 20 |
| Example 21 | 1.2 | 0.150 | 0.050 | — | — | — | — | — | — | 20 |
| Example 22 | 0.2 | 0.016 | — | 4 | — | — | — | — | — | 20 |
| Example 23 | 0.3 | 0.016 | — | 20 | — | — | — | — | — | 20 |
| Example 24 | 1.2 | 0.150 | — | 45 | — | — | — | — | — | 20 |
| Example 25 | 0.3 | 0.016 | — | 98 | — | — | — | — | — | 20 |
| Example 26 | 1.2 | 0.150 | — | 3 | — | — | — | — | — | 20 |
| Example 27 | 1.2 | 0.150 | — | 97 | — | — | — | — | — | 20 |
| Example 28 | 0.3 | 0.016 | 0.004 | 3 | — | — | — | — | — | 20 |
| Example 29 | 0.2 | 0.017 | 0.004 | 20 | — | — | — | — | — | 20 |
| Example 30 | 0.3 | 0.016 | 0.004 | 45 | — | — | — | — | — | 20 |
| Example 31 | 0.2 | 0.016 | 0.003 | 99 | — | — | — | — | — | 20 |
| Example 32 | 1.2 | 0.016 | 0.050 | 4 | — | — | — | — | — | 20 |
| Example 33 | 1.2 | 0.016 | 0.050 | 95 | — | — | — | — | — | 20 |
| Example 34 | 0.2 | 0.150 | 0.004 | 5 | — | — | — | — | — | 20 |
| Example 35 | 0.3 | 0.150 | 0.003 | 98 | — | — | — | — | — | 20 |
| Example 36 | 1.2 | 0.150 | 0.050 | 4 | — | — | — | — | — | 20 |
| Example 37 | 1.2 | 0.150 | 0.050 | 99 | — | — | — | — | — | 20 |
| Example 38 | 1.2 | 0.150 | 0.050 | 20 | 30 | — | — | — | — | 20 |
| Example 39 | 1.2 | 0.150 | 0.050 | 30 | 50 | — | — | — | — | 20 |
| Example 40 | 1.2 | 0.150 | — | — | 6 | — | — | — | — | 20 |
| Example 41 | 0.2 | 0.016 | — | — | 100 | — | — | — | — | 20 |
| Example 42 | 0.2 | 0.016 | 0.006 | — | 3 | — | — | — | — | 20 |
| Example 43 | 0.1 | 0.016 | 0.007 | — | 97 | — | — | — | — | 20 |
| Example 44 | 0.1 | 0.016 | — | — | — | 3 | — | — | — | 20 |
| Example 45 | 0.2 | 0.016 | — | — | — | 98 | — | — | — | 20 |

TABLE 1-2

| Remarks | Concentration of Ni relative to entire wire (wt. %) | Thickness of Pd coating layer (μm) | Thickness of Au skin layer (μm) | Concentration of each element relative to entire wire | | | | Concentration of each element in Cu alloy core material | | Wire diameter (μm) |
|---|---|---|---|---|---|---|---|---|---|---|
| | | | | B conc. (wt. ppm) | In conc. (wt. ppm) | Ca conc. (wt. ppm) | P conc. (wt. ppm) | Pt conc. (wt. %) | Pd conc. (wt. %) | |
| Example 46 | 0.1 | 0.016 | 0.006 | — | — | 3 | — | — | — | 20 |
| Example 47 | 0.1 | 0.016 | 0.008 | — | — | 99 | — | — | — | 20 |
| Example 48 | 0.2 | 0.016 | — | — | — | — | 5 | — | — | 20 |
| Example 49 | 0.2 | 0.016 | — | — | — | — | 98 | — | — | 20 |
| Example 50 | 0.1 | 0.016 | 0.007 | — | — | — | 6 | — | — | 20 |
| Example 51 | 0.1 | 0.016 | 0.006 | — | — | — | 97 | — | — | 20 |
| Example 52 | 0.2 | 0.016 | — | — | — | — | — | 0.05 | — | 20 |
| Example 53 | 0.2 | 0.016 | — | — | — | — | — | 1.20 | — | 20 |
| Example 54 | 1.2 | 0.150 | — | — | — | — | — | 0.05 | — | 20 |
| Example 55 | 1.2 | 0.150 | — | — | — | — | — | 1.20 | — | 20 |
| Example 56 | 0.2 | 0.016 | 0.003 | — | — | — | — | 0.05 | — | 20 |
| Example 57 | 0.2 | 0.016 | 0.003 | — | — | — | — | 1.20 | — | 20 |
| Example 58 | 1.2 | 0.016 | 0.05 | — | — | — | — | 0.05 | — | 20 |
| Example 59 | 1.2 | 0.016 | 0.05 | — | — | — | — | 1.20 | — | 20 |
| Example 60 | 0.2 | 0.150 | 0.003 | — | — | — | — | 0.05 | — | 20 |
| Example 61 | 0.3 | 0.150 | 0.003 | — | — | — | — | 1.20 | — | 20 |
| Example 62 | 1.2 | 0.150 | 0.05 | — | — | — | — | 0.05 | — | 20 |
| Example 63 | 1.2 | 0.150 | 0.05 | — | — | — | — | 1.20 | — | 20 |
| Example 64 | 1.2 | 0.150 | 0.05 | 20 | — | — | — | 0.30 | — | 20 |
| Example 65 | 1.2 | 0.150 | 0.05 | 30 | 60 | — | — | 0.40 | — | 20 |
| Example 66 | 0.3 | 0.016 | — | — | — | — | — | — | 0.05 | 20 |
| Example 67 | 0.2 | 0.016 | — | — | — | — | — | — | 1.20 | 20 |
| Example 68 | 0.2 | 0.016 | 0.006 | — | — | — | — | — | 0.05 | 20 |
| Example 69 | 0.3 | 0.016 | 0.006 | — | — | — | — | — | 1.20 | 20 |
| Example 70 | 0.2 | 0.016 | 0.006 | 30 | — | — | — | — | 0.30 | 20 |
| Example 71 | 0.3 | 0.016 | 0.006 | 40 | 50 | — | — | — | 0.35 | 20 |
| Example 72 | 0.7 | 0.100 | 0.0004 | — | — | — | — | — | — | 20 |
| Example 73 | 0.7 | 0.100 | — | 2 | — | — | — | — | — | 20 |
| Example 74 | 0.7 | 0.100 | — | 115 | — | — | — | — | — | 20 |

TABLE 1-2-continued

| Remarks | Concentraton of Ni relative to entire wire (wt. %) | Thickness of Pd coating layer (μm) | Thickness of Au skin layer (μm) | Concentration of each element relative to entire wire | | | | Concentration of each element in Cu alloy core material | | Wire diameter (μm) |
|---|---|---|---|---|---|---|---|---|---|---|
| | | | | B conc. (wt. ppm) | In conc. (wt. ppm) | Ca conc. (wt. ppm) | P conc. (wt. ppm) | Pt conc. (wt. %) | Pd conc. (wt. %) | |
| Example 75 | 0.7 | 0.100 | 0.08 | 2 | — | — | — | — | — | 20 |
| Example 76 | 0.7 | 0.100 | 0.08 | 115 | — | — | — | — | — | 20 |
| Example 77 | 0.7 | 0.100 | — | — | 2 | — | — | — | — | 20 |
| Example 78 | 0.7 | 0.100 | — | — | 108 | — | — | — | — | 20 |
| Example 79 | 0.7 | 0.100 | — | — | — | 2 | — | — | — | 20 |
| Example 80 | 0.7 | 0.100 | — | — | — | 104 | — | — | — | 20 |
| Example 81 | 0.7 | 0.100 | — | — | — | — | 2 | — | — | 20 |
| Example 82 | 0.7 | 0.100 | — | — | — | — | 106 | — | — | 20 |
| Example 83 | 0.7 | 0.100 | — | — | — | — | — | 0.03 | — | 20 |
| Example 84 | 0.7 | 0.100 | — | — | — | — | — | 1.30 | — | 20 |
| Example 85 | 0.7 | 0.100 | 0.006 | — | — | — | — | 0.03 | — | 20 |
| Example 86 | 0.7 | 0.100 | 0.100 | — | — | — | — | 1.30 | — | 20 |
| Example 87 | 0.7 | 0.100 | — | — | — | — | — | — | 0.03 | 20 |
| Example 88 | 0.7 | 0.100 | — | — | — | — | — | — | 1.30 | 20 |
| Example 89 | 0.7 | 0.100 | 0.006 | — | — | — | — | — | 0.03 | 20 |
| Example 90 | 0.7 | 0.100 | 0.100 | — | — | — | — | — | 1.30 | 20 |

TABLE 1-3

| Remarks | Concentration of Ni relative to entire wire (wt. %) | Thickness of Pd coating layer (μm) | Thickness of Au skin layer (μm) | Concentration of each element relative to entire wire | | | | | Concentration of each element in Cu alloy core material | | Wire diameter (μm) |
|---|---|---|---|---|---|---|---|---|---|---|---|
| | | | | B conc. (wt. ppm) | In conc. (wt. ppm) | Ca conc. (wt. ppm) | P conc. (wt. ppm) | Ti conc. (wt. ppm) | Pt conc. (wt. %) | Pd conc. (wt. %) | |
| Example 91 | 0.7 | 0.1 | — | — | — | — | — | 2 | — | — | 20 |
| Example 92 | 0.7 | 0.1 | — | — | — | — | — | 103 | — | — | 20 |
| Example 93 | 0.7 | 0.1 | 0.080 | — | — | — | — | 2 | — | — | 20 |
| Example 94 | 0.7 | 0.1 | 0.080 | — | — | — | — | 103 | — | — | 20 |

TABLE 2

| Remarks | Concentraton of Ni relative to entire wire (wt. %) | Thickness of Pd coating layer (μm) | Thickness of Au skin layer (μm) | Concentration of each element relative to entire wire | | | | Concentration of each element in Cu alloy core material | | Wire diameter (μm) |
|---|---|---|---|---|---|---|---|---|---|---|
| | | | | B conc. (wt. ppm) | In conc. (wt. ppm) | Ca conc. (wt. ppm) | P conc. (wt. ppm) | Pt conc. (wt. %) | Pd conc. (wt. %) | |
| Comparative Example 1 | 0.05 | 0.010 | — | — | — | — | — | — | — | 20 |
| Comparative Example 2 | 0.05 | 0.110 | — | — | — | — | — | — | — | 20 |
| Comparative Example 3 | 0.05 | 0.010 | — | — | — | — | — | — | — | 20 |
| Comparative Example 4 | 1.30 | 0.120 | — | — | — | — | — | — | — | 20 |
| Comparative Example 5 | 0.80 | 0.160 | — | — | — | — | — | — | — | 20 |

(Method of Evaluation)

The bonding reliability was determined by manufacturing a sample for bonding reliability evaluation, followed by evaluating the bonding longevity of the ball bonded part when exposed to a high-temperature and high humidity environment.

The sample for bonding reliability evaluation was manufactured by performing ball bonding onto an electrode, which has been formed by forming an alloy of Al-0.5% Cu as a film with a thickness of 1.0 μm on a Si substrate on a general metallic frame, using a commercially available wire bonder and sealing it with a commercially available epoxy resin. A ball was formed while flowing an $N_2$+5% $H_2$ gas at a flow rate of 0.4 to 0.6 L/min, and its size was a diameter of a range from 34 to 36 μm.

The manufactured sample for bonding reliability evaluation was exposed to a high-temperature and high-humidity environment of a temperature of 150° C. and a relative humidity of 85% using an unsaturated type pressure cooker tester. A shear test on the ball bonded part was performed every 100 hours, and a time until a value of shear strength became half of the initial shear strength was determined to be the bonding longevity of the ball bonded part. The shear test after the high-temperature and high-humidity test was carried out after removing a resin by acid treatment and exposing the ball bonded part.

A tester manufactured by DAGE was used for a shear tester. An average value of measurement values on 10 ball bonded parts randomly selected was used for the value of the shear strength. In the above evaluation, the bonding longevity being less than 1500 hours was determined to be practically problematic to be marked with a symbol of "triangle," being 1500 to 2000 hours was determined to be practically no problem to be marked with a symbol of "circle," being 2000 hours or more was determined to be especially excellent to be marked to with a symbol of "double circle" in the column "High-temperature and high-humidity test" in Tables 3-1, 3-2 and 4.

For the evaluation of ball formability, a ball before performing bonding was collected and observed, and there were evaluated the presence or absence of voids on a surface of the ball and the presence or absence of deformation of the ball, which is primarily a perfect sphere. The occurrence of any of the above was determined to be faulty. The formation of the ball was performed while an $N_2+5\%$ $H_2$ gas was blown at a flow rate of 0.4 to 0.6 L/min in order to reduce oxidation in a melting process. The size of the ball was 26, 32 and 38 μm. For one condition, 30 balls were observed. An SEM was used for the observation. In the evaluation of the ball formability, a case where three or more failures occurred was determined to be problematic to be marked with a symbol of "triangle," a case of one or two failures was determined to be no problem to be marked with a symbol of "circle," and a case where no failure occurred was determined to be excellent to be marked with a symbol of "double circle" in the column "Ball formability" in Tables 3-1, 3-2 and 4.

The evaluation of wedge bondability on the wire bonded part was determined by performing 1,000 pieces of bonding on leads of a lead frame and evaluating by the occurrence frequency of peeling of the bonded part. An Fe-42 at. % Ni alloy lead frame plated with 1 to 3 μm Ag was used for the lead frame. In this evaluation, assuming more rigorous bonding conditions than normal, a stage temperature was set to be 150° C., which was lower than a generally set temperature range. In the above evaluation, a case where six or more failures occurred was determined to be problematic to be marked with a symbol of "triangle," a case of one to five failures was determined to be no problem to be marked with a symbol of "circle," and a case where no failure occurred was determined to be excellent to be marked with a symbol of "double circle" in the column "Wedge bondability" in Tables 3-1, 3-2 and 4.

The evaluation of a crushed shape of the ball bonded part was determined by observing the ball bonded part from immediately above after bonding and evaluating by its sphericity. For an object to be bonded with the bonding wire, an electrode in which an Al-0.5% Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the above evaluation, a case where six or more failures occurred was determined to be problematic to be marked with a symbol of "triangle," being one to five was determined to be no problem to be marked with a symbol of "circle," and a case where a favorable perfect circle was obtained for all was determined to be especially excellent to be marked with a symbol of "double circle" in the column "Crushed shape" in Tables 3-1, 3-2 and 4.

The evaluation of a loop formability was determined based on linearity and variation in height. The forming condition of loop was a loop length of 2 mm and a maximum height of 80 μm. The maximum height of loop was a distance from an electrode surface of ball bonded part to a topmost height of wire. For the evaluation of linearity, 50 bonding wires were observed for one condition using a scanning electron microscope. A case where a maximum gap between an axis that connects a ball bonded part and a wire bonded part with straight line and a bonding wire was less than 45 μm was determined to be good, and a case of 45 μm or more was determined to be faulty. For the evaluation of variation in height, 50 bonding wires were observed for one condition using a scanning electron microscope and an average height was calculated. A case where a deviation from average value was less than 15 μm was determined to be good, and a case of 15 μm or more was determined to be faulty. In the above evaluation, a case where six or more failures of any of linearity and variation in height occurred was determined to be problematic to be marked with a symbol of "triangle," a case of one to five failures was determined to be no problem to be marked with a symbol of "circle," and a case where no failure occurred was determined to be excellent to be marked with a symbol of "double circle" in the column "Loop formability" in Tables 3-1, 3-2 and 4.

TABLE 3-1

| Remarks | High-temperature and high-humidity test (Temp.: 150° C.; Relative humidity: 85%) | Ball formability | | | Wedge bondability | Crushed shape | Loop formability |
| --- | --- | --- | --- | --- | --- | --- | --- |
| | | Ball diameter φ26 μm | Ball diameter φ32 μm | Ball diameter φ38 μm | | | |
| Example 1 | ○ | ◎ | ◎ | ◎ | ○ | ○ | ○ |
| Example 2 | ○ | ◎ | ◎ | ◎ | ○ | ○ | ○ |
| Example 3 | ○ | ◎ | ◎ | ◎ | ○ | ○ | ○ |
| Example 4 | ○ | ◎ | ◎ | ◎ | ○ | ○ | ○ |
| Example 5 | ○ | ◎ | ◎ | ◎ | ○ | ○ | ○ |
| Example 6 | ○ | ◎ | ◎ | ◎ | ○ | ○ | ○ |
| Example 7 | ○ | ◎ | ◎ | ◎ | ○ | ○ | ○ |
| Example 8 | ○ | ◎ | ◎ | ◎ | ○ | ○ | ○ |
| Example 9 | ○ | ◎ | ◎ | ◎ | ◎ | ○ | ○ |
| Example 10 | ◎ | ◎ | ◎ | ◎ | ◎ | ○ | ○ |
| Example 11 | ◎ | ◎ | ◎ | ◎ | ◎ | ○ | ○ |
| Example 12 | ◎ | ◎ | ◎ | ◎ | ◎ | ○ | ○ |
| Example 13 | ◎ | ◎ | ◎ | ◎ | ◎ | ○ | ○ |
| Example 14 | ◎ | ◎ | ◎ | ◎ | ◎ | ○ | ○ |
| Example 15 | ◎ | ◎ | ◎ | ◎ | ◎ | ○ | ○ |
| Example 16 | ◎ | ◎ | ◎ | ◎ | ◎ | ○ | ○ |

TABLE 3-1-continued

| Remarks | High-temperature and high-humidity test (Temp.: 150° C.; Relative humidity: 85%) | Ball formability Ball diameter φ26 μm | Ball diameter φ32 μm | Ball diameter φ38 μm | Wedge bondability | Crushed shape | Loop formability |
|---|---|---|---|---|---|---|---|
| Example 17 | ◎ | ◎ | ◎ | ◎ | ◎ | ○ | ○ |
| Example 18 | ◎ | ◎ | ◎ | ◎ | ◎ | ○ | ○ |
| Example 19 | ◎ | ◎ | ◎ | ◎ | ◎ | ○ | ○ |
| Example 20 | ◎ | ◎ | ◎ | ◎ | ◎ | ○ | ○ |
| Example 21 | ◎ | ◎ | ◎ | ◎ | ◎ | ○ | ○ |
| Example 22 | ○ | ◎ | ◎ | ◎ | ○ | ◎ | ○ |
| Example 23 | ○ | ◎ | ◎ | ◎ | ○ | ◎ | ○ |
| Example 24 | ○ | ◎ | ◎ | ◎ | ○ | ◎ | ○ |
| Example 25 | ○ | ◎ | ◎ | ◎ | ○ | ◎ | ○ |
| Example 26 | ○ | ◎ | ◎ | ◎ | ○ | ◎ | ○ |
| Example 27 | ○ | ◎ | ◎ | ◎ | ○ | ◎ | ○ |
| Example 28 | ◎ | ◎ | ◎ | ◎ | ◎ | ◎ | ○ |
| Example 29 | ◎ | ◎ | ◎ | ◎ | ◎ | ◎ | ○ |
| Example 30 | ◎ | ◎ | ◎ | ◎ | ◎ | ◎ | ○ |
| Example 31 | ◎ | ◎ | ◎ | ◎ | ◎ | ◎ | ○ |
| Example 32 | ◎ | ◎ | ◎ | ◎ | ◎ | ◎ | ○ |
| Example 33 | ◎ | ◎ | ◎ | ◎ | ◎ | ◎ | ○ |
| Example 34 | ◎ | ◎ | ◎ | ◎ | ◎ | ◎ | ○ |
| Example 35 | ◎ | ◎ | ◎ | ◎ | ◎ | ◎ | ○ |
| Example 36 | ◎ | ◎ | ◎ | ◎ | ◎ | ◎ | ○ |
| Example 37 | ◎ | ◎ | ◎ | ◎ | ◎ | ◎ | ○ |
| Example 38 | ◎ | ◎ | ◎ | ◎ | ◎ | ◎ | ○ |
| Example 39 | ◎ | ◎ | ◎ | ◎ | ◎ | ◎ | ○ |
| Example 40 | ○ | ◎ | ◎ | ◎ | ○ | ◎ | ○ |
| Example 41 | ○ | ◎ | ◎ | ◎ | ○ | ◎ | ○ |
| Example 42 | ◎ | ◎ | ◎ | ◎ | ◎ | ◎ | ○ |
| Example 43 | ◎ | ◎ | ◎ | ◎ | ◎ | ◎ | ○ |
| Example 44 | ○ | ◎ | ◎ | ◎ | ○ | ◎ | ○ |
| Example 45 | ○ | ◎ | ◎ | ◎ | ○ | ◎ | ○ |

TABLE 3-2

| Remarks | High-temperature and high-humidity test (Temp.: 150° C.; Relative humidity: 85%) | Ball formability Ball diameter φ26 μm | Ball diameter φ32 μm | Ball diameter φ38 μm | Wedge bondability | Crushed shape | Loop formability |
|---|---|---|---|---|---|---|---|
| Example 46 | ◎ | ◎ | ◎ | ◎ | ◎ | ◎ | ○ |
| Example 47 | ◎ | ◎ | ◎ | ◎ | ◎ | ◎ | ○ |
| Example 48 | ○ | ◎ | ◎ | ◎ | ○ | ◎ | ○ |
| Example 49 | ○ | ◎ | ◎ | ◎ | ○ | ◎ | ○ |
| Example 50 | ◎ | ◎ | ◎ | ◎ | ◎ | ◎ | ○ |
| Example 51 | ◎ | ◎ | ◎ | ◎ | ◎ | ◎ | ○ |
| Example 52 | ○ | ◎ | ◎ | ◎ | ○ | ○ | ◎ |
| Example 53 | ○ | ◎ | ◎ | ◎ | ○ | ○ | ◎ |
| Example 54 | ○ | ◎ | ◎ | ◎ | ○ | ○ | ◎ |
| Example 55 | ○ | ◎ | ◎ | ◎ | ○ | ○ | ◎ |
| Example 56 | ◎ | ◎ | ◎ | ◎ | ◎ | ○ | ◎ |
| Example 57 | ◎ | ◎ | ◎ | ◎ | ◎ | ○ | ◎ |
| Example 58 | ◎ | ◎ | ◎ | ◎ | ◎ | ○ | ◎ |
| Example 59 | ◎ | ◎ | ◎ | ◎ | ◎ | ○ | ◎ |
| Example 60 | ◎ | ◎ | ◎ | ◎ | ◎ | ○ | ◎ |
| Example 61 | ◎ | ◎ | ◎ | ◎ | ◎ | ○ | ◎ |
| Example 62 | ◎ | ◎ | ◎ | ◎ | ◎ | ○ | ◎ |
| Example 63 | ◎ | ◎ | ◎ | ◎ | ◎ | ◎ | ◎ |
| Example 64 | ◎ | ◎ | ◎ | ◎ | ◎ | ◎ | ◎ |
| Example 65 | ◎ | ◎ | ◎ | ◎ | ◎ | ◎ | ◎ |
| Example 66 | ○ | ◎ | ◎ | ◎ | ○ | ◎ | ◎ |
| Example 67 | ○ | ◎ | ◎ | ◎ | ○ | ◎ | ◎ |
| Example 68 | ◎ | ◎ | ◎ | ◎ | ◎ | ◎ | ◎ |
| Example 69 | ◎ | ◎ | ◎ | ◎ | ◎ | ◎ | ◎ |
| Example 70 | ◎ | ◎ | ◎ | ◎ | ◎ | ◎ | ◎ |
| Example 71 | ◎ | ◎ | ◎ | ◎ | ◎ | ◎ | ◎ |
| Example 72 | ○ | ◎ | ◎ | ◎ | ○ | ○ | ○ |
| Example 73 | ○ | ◎ | ◎ | ◎ | ○ | ○ | ○ |
| Example 74 | ○ | ◎ | ◎ | ◎ | Δ | ◎ | ○ |
| Example 75 | ◎ | ◎ | ◎ | ◎ | Δ | ◎ | ○ |
| Example 76 | ◎ | ◎ | ◎ | ◎ | Δ | ◎ | ○ |
| Example 77 | ○ | ◎ | ◎ | ◎ | ○ | ◎ | ○ |
| Example 78 | ○ | ◎ | ◎ | ◎ | Δ | ◎ | ○ |

TABLE 3-2-continued

| Remarks | High-temperature and high-humidity test (Temp.: 150° C.; Relative humidity: 85%) | Ball formability | | | Wedge bondability | Crushed shape | Loop formability |
|---|---|---|---|---|---|---|---|
| | | Ball diameter φ26 μm | Ball diameter φ32 μm | Ball diameter φ38 μm | | | |
| Example 79 | ○ | ◎ | ◎ | ◎ | ○ | ○ | ○ |
| Example 80 | ○ | ◎ | ◎ | ◎ | △ | ◎ | ○ |
| Example 81 | ○ | ◎ | ◎ | ◎ | ○ | ○ | ○ |
| Example 82 | ○ | ◎ | ◎ | ◎ | △ | ◎ | ○ |
| Example 83 | ○ | ◎ | ◎ | ◎ | ○ | ○ | ○ |
| Example 84 | ○ | ◎ | ◎ | ◎ | △ | ○ | ◎ |
| Example 85 | ◎ | ◎ | ◎ | ◎ | ◎ | ○ | ○ |
| Example 86 | ◎ | ◎ | ◎ | ◎ | △ | ○ | ◎ |
| Example 87 | ○ | ◎ | ◎ | ◎ | ○ | ○ | ○ |
| Example 88 | ○ | ◎ | ◎ | ◎ | △ | ○ | ◎ |
| Example 89 | ◎ | ◎ | ◎ | ◎ | ◎ | ○ | ○ |
| Example 90 | ◎ | ◎ | ◎ | ◎ | △ | ○ | ◎ |
| Example 91 | ○ | ◎ | ◎ | ◎ | ○ | ○ | ○ |
| Example 92 | ○ | ◎ | ◎ | ◎ | △ | ◎ | ○ |
| Example 93 | ◎ | ◎ | ◎ | ◎ | △ | ○ | ○ |
| Example 94 | ◎ | ◎ | ◎ | ◎ | △ | ◎ | ○ |

TABLE 4

| Remarks | High-temperature and high-humidity test (Temp.: 150° C.; Relative humidity: 85%) | Ball formability | | | Wedge bondability | Crushed shape | Loop formability |
|---|---|---|---|---|---|---|---|
| | | Ball diameter φ26 μm | Ball diameter φ32 μm | Ball diameter φ38 μm | | | |
| Comparative Example 1 | △ | △ | △ | △ | ○ | ○ | △ |
| Comparative Example 2 | △ | ◎ | ◎ | ◎ | ○ | ○ | △ |
| Comparative Example 3 | △ | △ | △ | ○ | ○ | ○ | ○ |
| Comparative Example 4 | ○ | △ | △ | △ | ○ | ○ | ○ |
| Comparative Example 5 | ○ | △ | △ | △ | ○ | ○ | ○ |

(Evaluation Results)

The bonding wires according to Examples 1 through 94 each include a Cu alloy core material and a Pd coating layer formed on the surface of the Cu alloy core material, and the bonding wire contains Ni, the concentration of Ni is 0.1 to 1.2 wt. % relative to the entire wire, and the thickness of the Pd coating layer is 0.015 to 0.150 μm. It has been revealed that with this configuration the bonding wires according to Examples 1 through 94 can achieve a good bonding reliability and excellent ball formability. In contrast, for Comparative Examples 1 through 4, the concentration of Ni was out of the above range; and for Comparative Example 5, the thickness of the Pd coating layer was out of the above range. Therefore, there were not achieved sufficient effects in a bonding reliability and ball formability for Comparative Examples.

In Examples 10 through 21, 28 through 39, 42, 43, 46, 47, 50, 51, 56 through 65, 68 through 72, 75, 76, 85, 86, 89, 90, 93 and 94, it has been revealed that excellent bonding reliability can be obtained because they further include an Au skin layer on the Pd coating layer. In Examples 10 through 21, 28 through 39, 42, 43, 46, 47, 50, 51, 56 through 65, 68 through 71, 85 and 89, it has been revealed that further excellent wedge bondability can be obtained because a thickness of the Au skin layer is 0.0005 to 0.050 μm.

In Examples 22 through 51, 64, 65, 70, 71, 74, 76, 78, 80, 82, 92 and 94, it has been revealed that crushed shape of ball bonded part with excellent circularity can be achieved because the Cu alloy core material further contains at least one element selected from B, In, Ca, P and Ti, and a concentration of the elements is 3 wt. ppm or more relative to the entire wire.

In Examples 52 through 71, it has been revealed that good loop formability can be obtained because the Cu alloy core material further contains Pt or Pd and a concentration of Pt or Pd contained in the Cu alloy core material is 0.05 to 1.20 wt. %. In Examples 83, 85, 87 and 89, excellent loop formability was not obtained because the concentration of Pt or Pd was less than the lower limit of the above range. In Examples 84, 86, 88 and 90, excellent loop formability was obtained but wedge bondability decreased because the concentration of Pt or Pd exceeded the upper limit of the above range.

The invention claimed is:

1. A bonding wire for a semiconductor device comprising:
   a Cu alloy core material; and
   a Pd coating layer formed on a surface of the Cu alloy core material, the Pd coating layer having a Pd concentration of 50 at. % or more, wherein
   the Cu alloy core material contains Ni,
   a concentration of Ni is 0.1 to 1.2 wt. % relative to the entire wire, and
   a thickness of the Pd coating layer is 0.016 to 0.150 μm.

2. The bonding wire for a semiconductor device according to claim 1, further comprising an Au skin layer on the Pd coating layer.

3. The bonding wire for a semiconductor device according to claim 2, wherein a thickness of the Au skin layer is 0.0005 to 0.050 μm.

4. The bonding wire for a semiconductor device according to claim 1, wherein
   the Cu alloy core material further contains at least one element selected from B, In, Ca, P and Ti, and a concentration of the elements is 3 to 100 wt. ppm relative to the entire wire.

5. The bonding wire for a semiconductor device according to claim 1, wherein
the Cu alloy core material further contains Pt or Pd, and
a concentration of Pt or Pd contained in the Cu alloy core material is 0.05 to 1.20 wt. %.

6. The bonding wire for a semiconductor device according to claim 1, wherein Cu is present at an outermost surface of the bonding wire.

7. A bonding wire for ball bonding, comprising:
a Cu alloy core material; and
a Pd coating layer formed on a surface of the Cu alloy core material, the Pd coating layer having a Pd concentration of 50 at. % or more, wherein
the Cu alloy core material contains Ni,
a concentration of Ni is 0.1 to 1.2 wt. % relative to the entire wire,
a thickness of the Pd coating layer is 0.016 to 0.150 μm, and
a ball to be formed when the ball bonding is performed comprises an alloy containing Pd, Cu and Ni.

8. A bonding wire for a semiconductor device comprising:
a Cu alloy core material; and
a Pd coating layer formed on a surface of the Cu alloy core material, the Pd coating layer having a Pd concentration of 50 at. % or more, wherein
the Cu alloy core material contains Ni,
a concentration of Ni is 0.1 to 1.2 wt. % relative to the entire wire,
a thickness of the Pd coating layer is 0.016 to 0.150 μm, and
the Cu alloy core material contains 3 to 100 wt. ppm of P relative to the entire wire.

* * * * *